(12) United States Patent
Kojima (10) Patent No.: US 8,093,907 B2
(45) Date of Patent: Jan. 10, 2012

(54) TEST EQUIPMENT

(75) Inventor: Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 736 days.

(21) Appl. No.: 12/243,790

(22) Filed: Oct. 1, 2008

(65) Prior Publication Data

US 2009/0096465 A1    Apr. 16, 2009

(30) Foreign Application Priority Data

Oct. 16, 2007  (JP) ................................. 2007-268632

(51) Int. Cl.
*H01H 31/02* (2006.01)
(52) U.S. Cl. ........................................................ 324/555
(58) Field of Classification Search .................... 324/555
See application file for complete search history.

(56) References Cited

U.S. PATENT DOCUMENTS

| 3,725,582 | A | 4/1973 | Davis .............................. 178/58 |
| 2011/0050194 | A1* | 3/2011 | Kuwana et al. ............... 323/299 |

FOREIGN PATENT DOCUMENTS

| JP | 47-11702 | 10/1972 |
| JP | 08-023354 | 1/1996 |
| JP | 2006-023233 | 1/2006 |

* cited by examiner

*Primary Examiner* — Thomas Valone
(74) *Attorney, Agent, or Firm* — Martine Penilla Group, LLP (57) ABSTRACT

A test apparatus for a DUT having a bidirectional differential interface is provided.
A main driver amplifier generates a first differential signal Vd based on pattern data (PAT) to be transmitted to a DUT. A first replica driver amplifier generates a second differential signal (Vcp) based on the pattern data (PAT). A second replica driver amplifier generates a third differential signal (Vcn) based on the pattern data (PAT). A first comparator compares the voltages of a node (N1) and a node (N2), and a second comparator compares the voltages of a node (N3) and a node (N4).

13 Claims, 8 Drawing Sheets

FIG.4 RELATED TECHNIQUE

TEST EQUIPMENT

BACKGROUND OF THE INVENTION

1. Field of the Invention

The present invention relates to a test apparatus (equipment) and particularly to a technique for testing a DUT (Device Under Test) that transmits and receives a differential signal.

2. Description of the Related Art

A differential signal is used so as to transmit and receive signals to and from semiconductor devices. For example, in XDR-DRAM (extreme Data Rate Dynamic Random Access Memory), a differential signal is transmitted bidirectionally at high speed by using a single differential transmission line. In the case where a test is performed on a device having such bidirectional differential interface, the amplitude of a differential signal output from a DUT (Device Under Test) is measured and the quality check is performed.

A test apparatus for examining a DUT having a bidirectional differential interface is studied. A transmitter and a receiver, both connected to a common differential transmission line pair (hereinafter, also simply referred to as a differential transmission line), are provided in the test apparatus. The transmitter transmits a test pattern to the DUT, and the receiver determines the logical value of a differential signal pair (hereinafter, also simply referred to as a differential signal) output from the DUT or examines the amplitudes of the differential voltage of the differential signal pair.

The receiver of the test apparatus is connected not only to the DUT via the differential transmission line pair but also to the transmitter on the test apparatus side. Therefore, the test apparatus for DUT provided with the bidirectional differential interface needs to be designed in consideration of not being affected by the output signal of the transmitter adjacent to the receiver. Related techniques are described in patent documents 1 through 3. In particular, patent document 1 discloses a circuit (hybrid circuit) that cancels the own transmission signals and receives only the signals from the other side in bidirectional communication.

[Patent document 1] Japanese Patent Application Laid Open No. S47-11702

[Patent document 2] Japanese Patent Application Laid Open No. H8-23354

[Patent document 3] Japanese Patent Application Laid Open No. 2006-23233

SUMMARY OF THE INVENTION

In this background, a general purpose of the present invention is to provide a test apparatus for a DUT having a bidirectional differential interface.

MEANS FOR SOLVING THE PROBLEM

An embodiment of the present invention relates to a test apparatus for transmitting a differential signal bidirectionally to and from a device under test via a differential transmission line pair and for testing the device under test. The test apparatus comprises: a main driver amplifier operative to generate a first differential signal based on pattern data to be transmitted to the device under test; a first replica driver amplifier operative to generate a second differential signal based on the pattern data; a second replica driver amplifier operative to generate a third differential signal based on the pattern data; a first comparator; a second comparator; a first resistor provided between one output terminal of the main driver amplifier and a first terminal to which one of the differential transmission line pair is connected; a second resistor provided between the other output terminal of the main driver amplifier and a second terminal to which the other of the differential transmission line pair is connected; a third resistor provided between the first terminal and one input terminal of the first comparator; a fourth resistor provided between the second terminal and the other input terminal of the first comparator; a fifth resistor provided between the second terminal and one input terminal of the second comparator; a sixth resistor provided between the first terminal and the other input terminal of the second comparator; a seventh resistor provided between one output terminal of the first replica driver amplifier and the other input terminal of the first comparator; an eighth resistor provided between the other output terminal of the first replica driver amplifier and the other input terminal of the second comparator; a ninth resistor provided between one output terminal of the second replica driver amplifier and one input terminal of the second comparator; and a tenth resistor provided between the other output terminal of the second replica driver amplifier and one input terminal of the first comparator.

According to this embodiment, providing the two replica amplifiers can cancel the interference caused by the output signal of the main driver amplifier on the input voltages of the first and the second comparators and allows amplitude determination of the differential signal from the DUT to be performed.

A usual differential receiver requires a differential amplifier (analog subtractor) that amplifies the difference between a differential input signal pair and converts it to a single-ended signal. However, according to the embodiment, the differential amplifier is not required.

The common voltage of the first replica driver amplifier may be the common voltage of the main driver amplifier shifted in the positive direction, and the common voltage of the second replica driver amplifier may be the common voltage of the main driver amplifier shifted in the negative direction.

In this case, the first comparator allows the differential input signal to be compared with a determination threshold voltage at the high voltage side, and the second comparator allows the differential input signal to be compared with a determination threshold voltage at the low voltage side.

The first replica driver amplifier and the second replica driver amplifier each may be configured so that the common voltages of the second differential signal and the third differential signal can be adjusted.

In this case, the determination threshold voltage can be adjusted.

When resistances of the first and the second resistors are written as Ra, the resistances of the third resistor to the sixth resistor are approximately equal and may be given as $\alpha \cdot Ra$ ($\alpha$ is a parameter), and the resistances of the seventh resistor to the tenth resistor are approximately equal and may be given as $\beta \cdot Ra$ ($\beta$ is a parameter). Note that "·" denotes multiplication.

In this case, the resistance of each resistor can be designed on the basis of the output resistance of the main driver amplifier.

When the amplitude at half-maximum of the differential signal transmitted to the device under test via the differential transmission line is written as VI, when the amplitude at half-maximum of the first differential signal generated by the main driver amplifier is written as $\gamma \cdot VI$, and when the amplitudes at half-maximum of the second and third differential signals generated by the first and the second replica driver amplifiers are written as δ·VI, it may be designed so that the following equations are satisfied.

$$\delta = \beta/(2\cdot\alpha)$$

$$\gamma = [\alpha\cdot(\alpha+\beta+2)+\beta]/[\alpha\cdot(\alpha+\beta)]$$

In this case, the differential input signal sent from the DUT is free from the interference which is caused by the first differential signal output from the main driver amplifier because the interference can be completely canceled out.

The parameters α and β may satisfy a relational expression as follows.

$$\beta = [\alpha+2+\sqrt{(9\cdot\alpha^2+20\cdot\alpha+4)}]/2$$

In this case, γ and δ can be the same value, and thus the same amplifier can be used for the main driver amplifier and for the two replica driver amplifiers so that the designing can be simplified.

When the common voltage of the first replica driver amplifier is the common voltage of the main driver amplifier shifted by ϵ·VO in the positive direction, and when the common voltage of the second replica driver amplifier is the common voltage of the main driver amplifier shifted by ϵ·VO in the negative direction, an equation $\epsilon = \beta/(4\cdot\alpha)$ may be satisfied. In this case, by comparing the differential voltage of the differential input signal pair from the DUT with the voltages +Vo and −Vo, the quality check can be performed.

The current drivabilities (current capacities) of the first and the second replica driver amplifiers may be set lower than current drivability of the main driver amplifier. In this case, the power consumption can be reduced.

At least one among the main driver amplifier, the first replica driver amplifier, and the second replica driver amplifier may include both a first single amplifier that generates one of the differential signals based on the pattern data and a second single amplifier that generates the other differential signal based on the inverted pattern data.

A test apparatus according to an embodiment may further comprise: a cross-point monitoring differential comparator operative to compare voltage levels of a first terminal and a second terminal; a positive-side single-ended comparator operative to compare a voltage of the first terminal with a predetermined first threshold voltage and compare the voltage of the first terminal with a predetermined second threshold voltage; and a negative-side single-ended comparator operative to compare a voltage of the second terminal with a predetermined third threshold voltage and compare the voltage of the second terminal with a predetermined fourth threshold voltage.

Providing the cross-point monitoring differential comparator allows the detection of the cross point of the differential signal, and providing the positive-side single-ended comparator and the negative-side single-ended comparator allows the differential signal output from the device under test to be measured not as a differential signal but as a single-ended signal.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In this specification, a "condition where a member A is connected to a member B" refers to the condition where the member A and the member B are physically connected to each other directly and to the condition where the member A and the member B are connected indirectly via other members that do not affect the electrical connection. Similarly, a "condition where a member C is provided between the member A and the member B" refers to, in addition to the condition where the member A and the member C or the member B and the member C are connected to one another directly, the condition where the members are connected indirectly via other members that do not affect the electrical connection.

Figure 1:
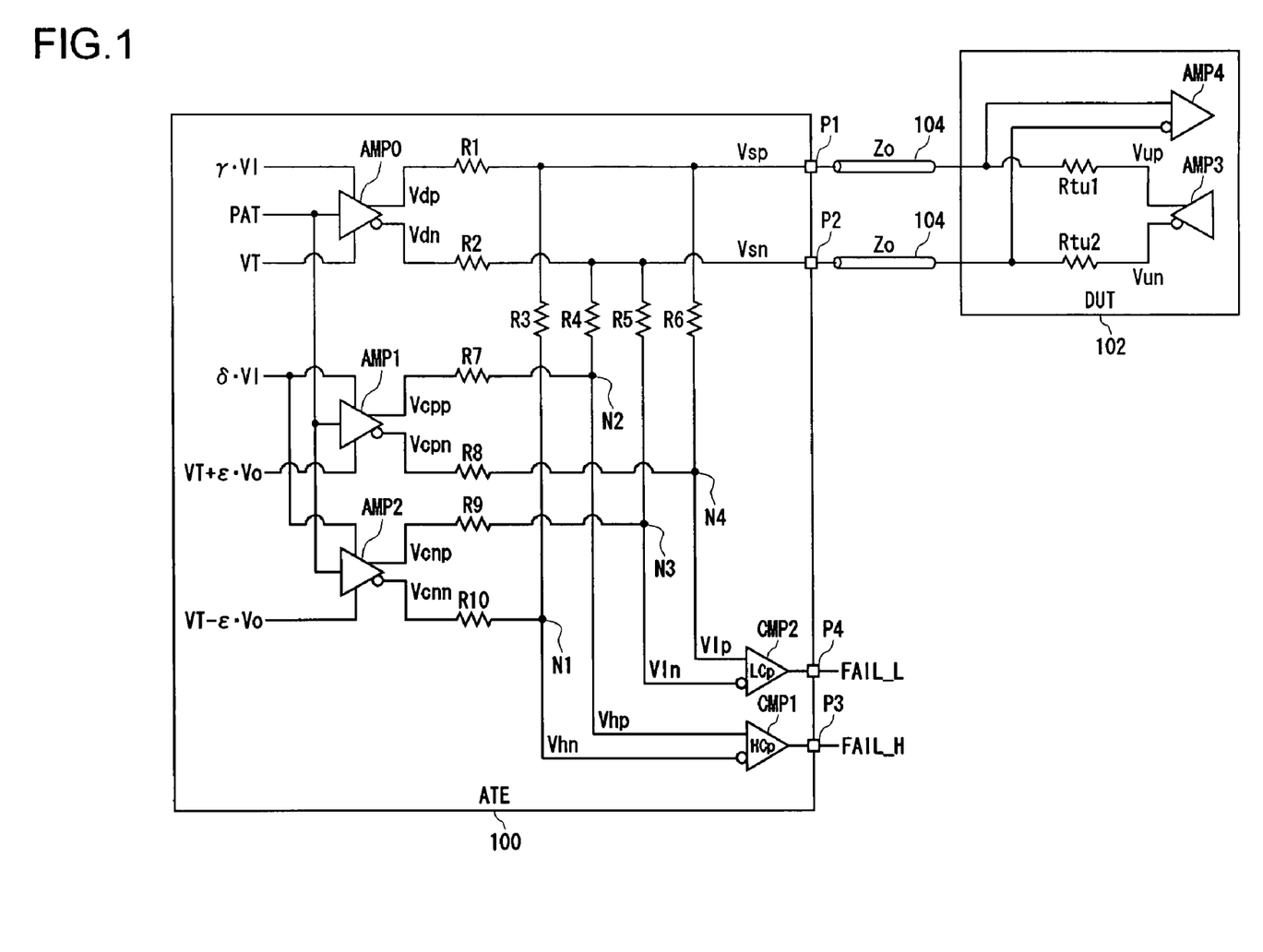
FIG. 1 is a circuit diagram showing the configuration of an ATE according to the embodiment.

The embodiment explained in the following relates to test equipment, and more specifically, automatic test equipment (ATE), for testing a device under test (DUT) having a bidirectional differential interface. FIG. 1 is a circuit diagram showing the configuration of an ATE 100 according to the embodiment. The ATE 100, being connected to a DUT 102 via a differential transmission line 104, outputs a differential signal to the DUT 102 or receives a differential signal output from the DUT 102.

The DUT 102 is provided with a transmission amplifier AMP3, a reception amplifier AMP4, and output resistors Rtu1 and Rtu2. A reception amplifier AMP4 generates a differential voltage (differential component) of the differential signal input via the differential transmission line 104 and transfers the differential voltage to an internal circuit (not shown). The differential signal input from the transmission amplifier AMP3 is input to the ATE 100 via the differential transmission line 104. The transmission amplifier AMP3 is provided with the output resistors Rtu1 and Rtu2. A characteristic impedance Zo of the differential transmission line 104 matches the output resistors Rtu1 and Rtu2 of the DUT 102.

The ATE 100 is provided both with a first input/output terminal P1 to which one of the differential transmission lines 104 is connected and with a second input/output terminal P2 to which the other differential transmission line 104 is connected. The ATE 100 is further provided with a main driver amplifier AMP0, a first replica driver amplifier AMP1, a second replica driver amplifier AMP2, a first comparator CMP1, a second comparator CMP2, and a first resistor R1 to a tenth resistor R10.

The main driver amplifier AMP0 generates a first differential signal Vd based on pattern data PAT to be transmitted to the DUT 102. Hereinafter, subscripts p and n, which respectively represent the positive and the negative components of two differential signals Vd, are added to the differential signal Vd as follows: Vdp and Vdn. Also, the subscripts p and n are omitted and the differential signal Vd is named generically as appropriate. The same applies to other differential signals.

The first resistor R1 is provided between one of the output terminals (non-inverting output terminal) of the main driver amplifier AMP0 and the first input/output terminal P1 to which one of the differential transmission lines 104 is connected. The second resistor R2 is provided between the other output terminal (inverting output terminal) of the main driver amplifier AMP0 and the second input/output terminal P2 to which the other differential transmission line 104 is connected. The first resistor R1 and the second resistor R2 are the output resistors of the main driver amplifier AMP0.

The first replica driver amplifier AMP1 generates second differential signals Vdcpp and Vcpn based on the pattern data PAT. The second replica driver amplifier AMP2 generates third differential signals Vdcnp and Vcnn based on the pattern data PAT.

The third resistor R3 is provided between the first input/output terminal P1 and one of the input terminals of the first comparator CMP1 (inverting input terminal). The fourth resistor R4 is provided between the second input/output terminal P2 and the other input terminal of the first comparator CMP1 (non-inverting input terminal). The fifth resistor R5 is provided between the second input/output terminal P2 and one of the input terminals of the second comparator CMP2 (inverting input terminal). The sixth resistor R6 is provided between the first input/output terminal P1 and the other input terminal of the second comparator CMP2 (non-inverting input terminal).

The seventh resistor R7 is provided between one of output terminals of the first replica driver amplifier AMP1 (non-inverting output terminal) and the other input terminal of the first comparator CMP1 (non-inverting input terminal). The eighth resistor R8 is provided between the other output terminal of the first replica driver amplifier AMP1 (inverting output terminal) and the other input terminal of the second comparator CMP2 (non-inverting input terminal).

The ninth resistor R9 is provided between one of output terminals of the second replica driver amplifier AMP2 (non-inverting output terminal) and one of the input terminals of the second comparator CMP2 (inverting input terminal). The tenth resistor R10 is provided between the other output terminal of the second replica driver amplifier AMP2 (inverting output terminal) and one of the input terminals of the first comparator CMP1 (inverting input terminal).

The first comparator CMP1 compares a voltage Vhn of a connection node N1 of the third resistor R3 and the tenth resistor R10 with a voltage Vhp of a connection node N2 of the fourth resistor R4 and the seventh resistor R7 and outputs a fail signal FAIL_H according to the magnitude relation. The second comparator CMP2 compares a voltage V1n of a connection node N3 of the fifth resistor R5 and the ninth resistor R9 with a voltage V1p of a connection node N4 of the sixth resistor R6 and the eighth resistor R8 and outputs a fail signal FAIL_L according to the magnitude relation.

The fail signal FAIL_H is at high level when the amplitude of the differential signal from the DUT 102 does not meet an upper determination threshold voltage. The fail signal FAIL_L is at high level when the amplitude of the differential signal from the DUT 102 does not meet a lower determination threshold voltage. The reasons will follow.

Figure 2:
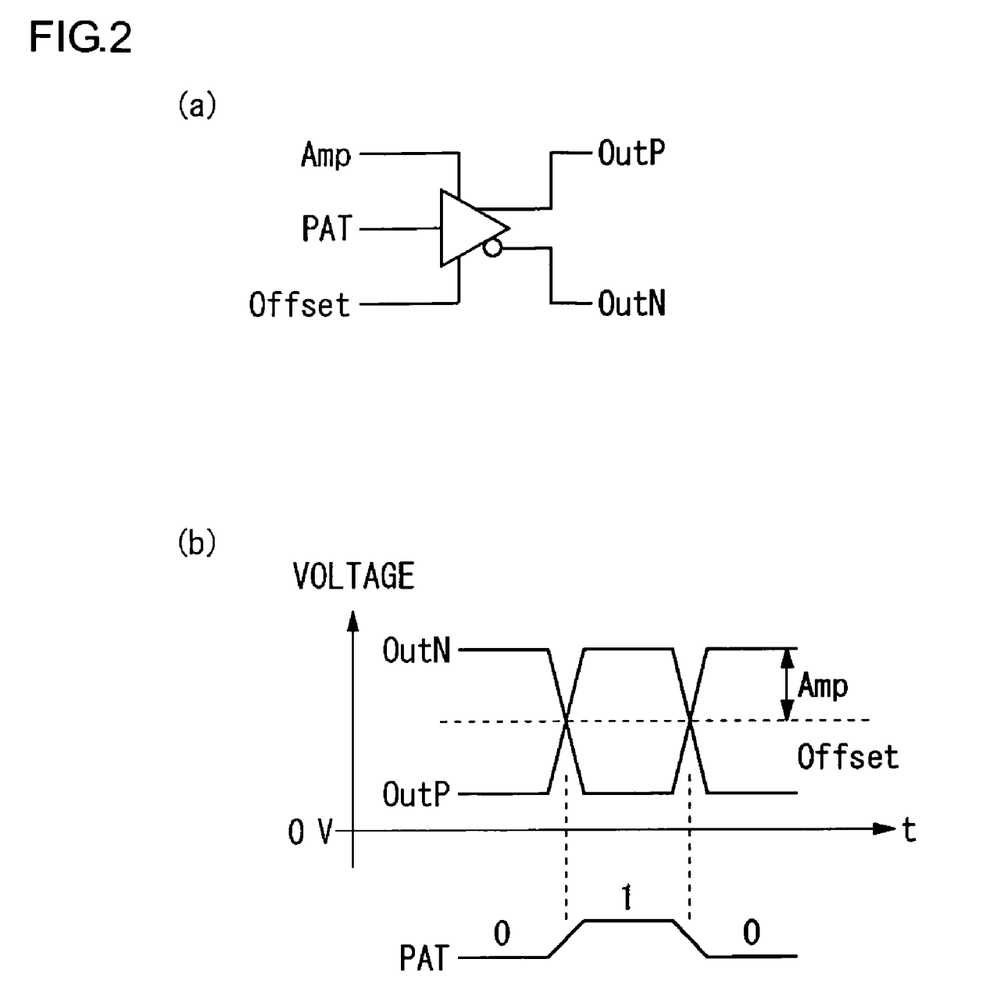
FIGS. 2A and 2B are diagrams explaining the operations of a main driver amplifier, a first replica driver amplifier, and a second replica driver amplifier in the circuit diagram in FIG. 1.

FIGS. 2A and 2B are diagrams explaining the operations of the main driver amplifier AMP0, the first replica driver amplifier AMP1, and the second replica driver amplifier AMP2 in the circuit diagram in FIG. 1. FIG. 2A shows the circuit symbol of an amplifier, and FIG. 2B shows the operation waveform of the amplifier. Amp represents an amplitude at half-maximum of differential output signals OutP and OutN, and Offset represents a bias voltage (common voltage) of the differential output signals OutP and OutN. The non-inverting output OutP and the inverting output OutN are as follows: when the input signal PAT is 1, $OutP = Offset + Amp$ and $OutN = Offset - Amp,$ and when the input PAT is 0, $OutP = Offset - Amp$ and $OutN = Offset + Amp.$ The amplifier shown by the circuit symbol of FIG. 2A merely shows the condition where the amplitude of the amplifier and the common voltage have values represented by Amp and Offs. The amplifier may not have a terminal for setting the amplitude and the common voltage.

According to ATE 100 in FIG. 1, by properly setting both the resistances of the resistors R1-R10 and the amplitudes and the common voltages of the main driver amplifier AMP0, of the first replica driver amplifier AMP1, and of the second replica driver amplifier AMP2, any interference caused by the first differential signal output from the main driver amplifier AMP0 can be eliminated from the input voltages of the first comparator CMP1 and the second comparator CMP2. The reason will be apparent in the following discussion.

Since there is infinite number of combinations of the resistance of the resistor and the properties of the amplifier, the method for designing the ATE 100 under some constraint conditions will be explained in the following.

For the sake of simplifying the design, the resistances of the third resistor R3 to the sixth resistor R6 are made equal, and the resistances of the seventh resistor R7 to the tenth resistor R10 are also made equal. When the resistances of the first resistor R1 and the second resistor R2 are written as Ra, the resistances of the third resistor R3 to the sixth resistor R6 are expressed as α·Ra (α is a parameter) and the resistances of the seventh resistor R7 to the tenth resistor R10 are expressed as β·Ra (β is a parameter).

A description is now given of the constraint conditions.
(Constraint Condition 1)

The impedance seen from the differential transmission line 104 to the ATE 100 matches the characteristic impedance of the differential transmission line 104. The impedances Rtu1 and Rtu2 of the DUT 102 are equal to Zo.
(Constraint Condition 2)

In order for the voltage amplitude received at DUT 102 to be VI, it is designed so that differential signals Vsp and Vsn when the DUT 102 is open (non-connected) can satisfy the following equations: when the pattern data is 1, $Vsp = VT + VI$ and $Vsn = VT - VI.$ (Constraint Condition 3)

The input voltages Vhp, Vhn, Vlp, and Vln of the first comparator CMP1 and the second comparator CMP2 are not affected by the output signal of the main driver amplifier AMP0. Thus, there is no VI term in the equations for Vhp, Vhn, Vlp, and Vln.

The common voltages of the first differential signals Vdp and Vdn output from the main driver amplifier AMP0 are equal to the common voltage of the differential signals Vsp and Vsn. Therefore, the common voltages of the main driver amplifier AMP0 are set to VT. The amplitudes at half-maximum of the first differential signals Vdp and Vdn output from the main driver amplifier AMP0 are written as γ·VI. The parameter γ is a positive constant.

The common voltages of the second differential signals Vcpp and Vcpn generated by the first replica driver amplifier AMP1 is given by VT+ε·Vo, which is the voltage obtained by shifting the common voltage VT of the main driver amplifier AMP0 in the positive direction. The common voltage of the second main driver amplifier AMP2 is given by VT−ε·Vo, which is the voltage obtained by shifting the common voltage VT in the negative direction. The parameter ε is a positive constant, and Vo is a value having the dimension of a voltage. With regard to ε and Vo, the description will follow. The amount to be shifted ε·Vo is same in both the positive and negative directions.

Preferably, the first replica driver amplifier AMP1 and the second replica driver amplifier AMP2 are configured so that the common voltage of the second differential signal Vcp and the third differential signal Vcn can be adjusted. In this case, the upper determination threshold voltage and the lower determination threshold voltage can be adjusted.

It is assumed that the amplitude at half-maximum of the second differential signal Vcp generated by the first replica driver amplifier AMP1 and the amplitude at half-maximum of the third differential signal Vcn generated by the second replica driver amplifier AMP2 are equal and are represented by δ·VI. The parameter δ is a positive constant.

The parameters α, β, and γ can be determined based on the constraint conditions stated above. The first differential signals Vdp and Vdn, the second differential signals Vcpp and Vcpn, and the third differential signals Vcnp and Vcnn are represented as follows: when PAT=1, $$Vdp = VT + \gamma \cdot VI \quad (B1)$$

$$Vdn = VT - \gamma \cdot VI \quad (B2)$$

$$Vcpp = VT + \varepsilon \cdot Vo + \delta \cdot VI \quad (B3)$$

$$Vcpn = VT + \varepsilon \cdot Vo - \delta \cdot VI \quad (B4)$$

$$Vcnp = VT - \varepsilon \cdot Vo + \delta \cdot VI \quad (B5)$$

$$Vcnn = VT - \varepsilon \cdot Vo - \delta \cdot VI. \quad (B6)$$

When PAT=0, it is necessary to replace VI in the equations B1-B6 with −VI. The equations shown in the following are satisfied only when PAT=1.

In order to solve for the input voltages of the first comparator CMP1 and the second comparator CMP2, the following equations C1-C4 are obtained.

$$Vhp = \frac{\beta \cdot Vsn + \alpha \cdot Vcpp}{\alpha + \beta} \quad (C1)$$

$$Vhn = \frac{\beta \cdot Vsp + \alpha \cdot Vcnn}{\alpha + \beta} \quad (C2)$$

$$Vlp = \frac{\beta \cdot Vsp + \alpha \cdot Vcpn}{\alpha + \beta} \quad (C3)$$

$$Vln = \frac{\beta \cdot Vsn + \alpha \cdot Vcnp}{\alpha + \beta} \quad (C4)$$

Taking the constraint condition 1 into consideration, the impedance seen from both the first input/output terminal P1 and the second input/output terminal P2 to the inside of the ATE 100 needs to be equal to the characteristic impedance Zo. In other words, the following equation D1 needs to be satisfied.

$$Z_0 = Rtu = Ra \cdot \left( \frac{\alpha + \beta}{\alpha + \beta + 2} \right) \quad (D1)$$

From the equation D1, if α and β are determined, the resistance Ra of the first resistor R1 and the second resistor R2, which are the output resistors of the main driver amplifier AMP0, is uniquely obtained.

In order to satisfy the constraint condition 2, the following equation needs to be satisfied.

$$\alpha + \beta + 2 = \gamma(\alpha + \beta) - 2 \cdot \delta \quad (D2)$$

Using the equations D1 and D2, the differential signal Vs when the DUT 102 is connected is obtained as follows.

$$Vsp = (Vup + VT + VI)/2 \quad (D3)$$

$$Vsn = (Vun + VT - VI)/2 \quad (D4)$$

Taking the constraint condition 3 into consideration, the VI term is deleted from the equations for the input voltages of the first comparator CMP1 and the second comparator CMP2. In order to solve for γ δ ε by using the constraint condition 3 and the equations C1, C2, D3, D4, B3, and B6, the following equations E1 and E2 are obtained.

$$\delta = \frac{\beta}{2 \cdot \alpha} \quad (E1)$$

$$\gamma = \frac{\alpha \cdot (\alpha + \beta + 2) + \beta}{\alpha \cdot (\alpha + \beta)} \quad (E2)$$

$$\varepsilon = \frac{\beta}{4 \cdot \alpha} \quad (E3)$$

Upon satisfaction of the equations E1 and E2, any interference caused by the output signal of the main driver amplifier AMP0 can be eliminated from the input voltages of the first comparator CMP1 and the second comparator CMP2.

Taking note on the output signals FAIL_L and FAIL_H, respectively, of the first comparator CMP1 and the second comparator CMP2 when the equation E3 is satisfied, the following relational expressions F1-F4 are established.

When $Vup - Vun < Vo$, FAIL_H = HI. (F1)

When $Vup - Vun > Vo$, FAIL_H = LO. (F2)

When $Vup - Vun > -Vo$, FAIL_L = HI. (F3)

When $Vup - Vun < -Vo$, FAIL_L = LO. (F4)

Thus, when the equation E3 is satisfied, by comparing the differential voltage (Vup−Vun) of the differential input signal Vu pair from the DUT 102 with the voltages +Vo and −Vo, the quality check can be performed.

In addition to the above stated constraint conditions 1-3, the following constraint conditions may be taken into consideration.

(Constraint Condition 4)

It is assumed that $\alpha \gg 1$, $\beta \gg 1$.

As $\alpha$ and $\beta$ become larger, not only the power consumption becomes smaller, but also the interference caused by both the additionally established first replica driver amplifier AMP1 and second replica amplifier AMP2 on the main driver amplifier AMP0 becomes smaller. However, it is not practical to increase $\alpha$ and $\beta$ infinitely, considering that the input capacitances of the first comparator CMP1 and the second comparator CMP2 affect the performance. For example, $\alpha$ and $\beta$ are preferably set in the range of $1<\alpha<10$ and $1<\beta<10$. The values of $\alpha$ and $\beta$, for example, may be around $\alpha=3$ and $\beta=6$.

(Constraint Condition 5)

If the resistance Ra of the first resistor R1 and the second resistor R2 is larger than the characteristic impedance Zo of the differential transmission line 104, it can be set arbitrary. However, as a practical range, the following relational expression may be established.

$$1.1 \cdot Zo \leq Ra \leq 1.3 \cdot Zo$$

(Constraint Condition 6)

The amplitudes of the main driver amplifier AMP0, the first replica driver amplifier AMP1, and the second replica driver amplifier AMP2 are made equal. In other words, it is designed so that the following equation can be established.

$$\gamma = \delta$$

In this case, the circuit designing can be simplified since the same amplifier can be used for each amplifier.

In order to satisfy the constraint condition 6, the equation G1 should to be satisfied.

$$\beta = \frac{1}{2} \cdot \left(\alpha + 2 + \sqrt{9 \cdot \alpha^2 + 20\alpha + 4}\right) \tag{G1}$$

Taking the equation G1 into consideration, once $\alpha$ is determined, the other parameters can be determined uniquely, and the degree of freedom in designing becomes 1.

Figure 3:
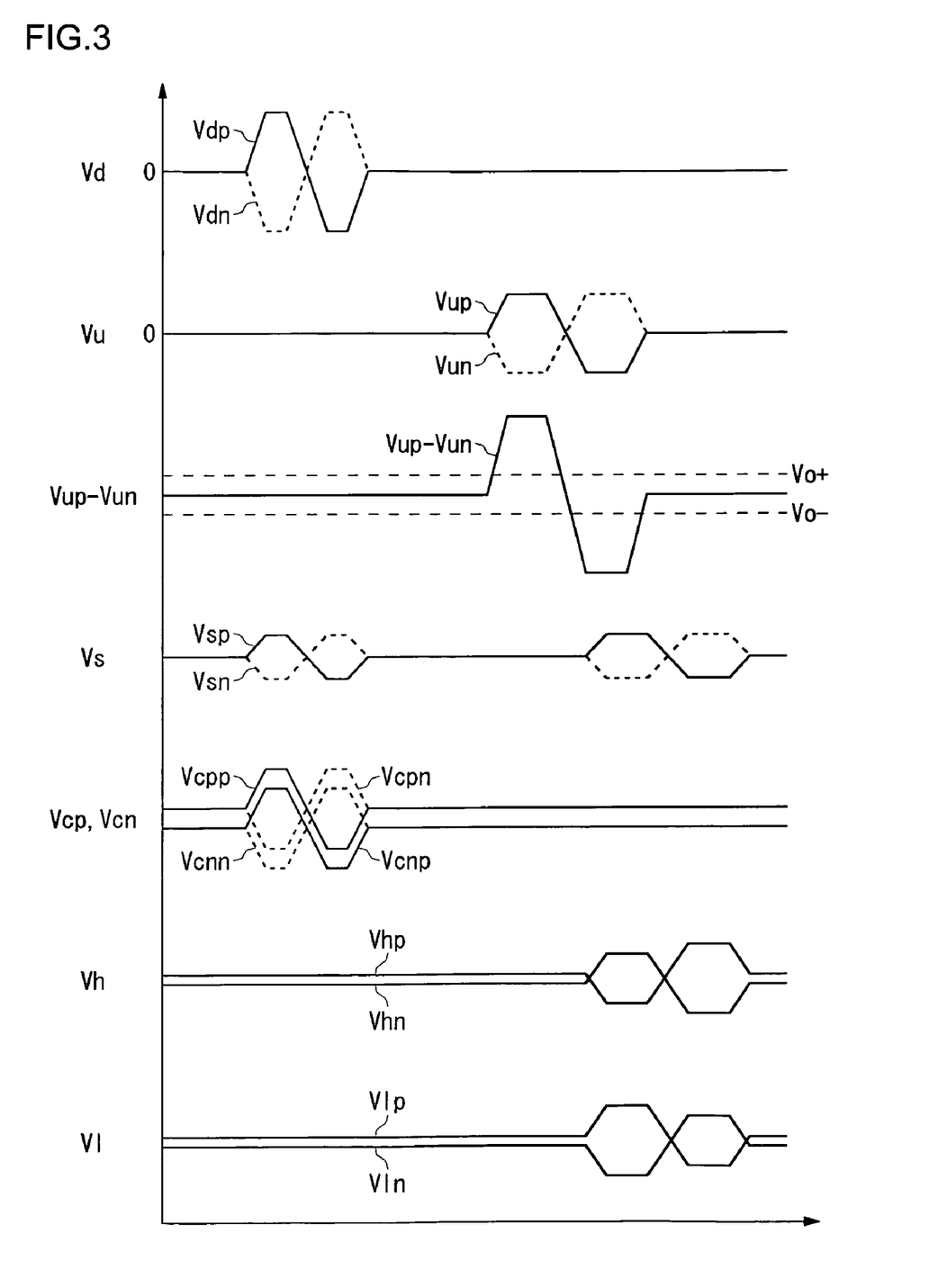
FIG. 3 is a time chart showing the operating state of the ATE in FIG. 1.

Described above is the configuration of ATE100. The description is now given of the operation of the ATE 100 in the following. FIG. 3 is a time chart showing the operating state of the ATE 100 in FIG. 1.

Beginning at the top, FIG. 3 shows the output signal Vd of the main driver amplifier AMP0, the output signal Vu of the DUT 102, the differential component (Vup−Vun) of the output signal of the DUT 102, the signal Vs of the differential transmission line 104 at the ATE 100 side, the output signals Vcp and Vcn, respectively, of the first replica driver amplifier AMP1 and the second replica driver amplifier AMP2, and the input signals Vh and Vl, respectively, of the first comparator CMP1 and the second comparator CMP2. The parameters are as follows.

VI=1V, $\gamma$=1.42, VT=0V, Vo=0.5V, $\delta=\gamma$, and $\epsilon \cdot$Vo=0.355V The differential signal Vd having an amplitude at half-maximum of $\gamma \cdot$VI=1.42V is output from the main driver amplifier AMP0. On the other hand, the differential signal Vu having an amplitude at half-maximum of 1V is output from the DUT 102. The second differential signal represented by Vu has a virtual wave pattern and shows the differential component Vup−Vun of the differential signal Vu having an amplitude at half-maximum 2V. The ATE 100 is designed so that when Vup−Vun>Vo, the first comparator CMP1 outputs a pass (low level) signal and that when Vup−Vun<−Vo, the second comparator CMP2 outputs a pass (low level) signal. This can be confirmed by the wave patterns of the third signal and below.

The differential signal Vs at the ATE 100 side of the differential transmission line 104 is a combined signal of the output signal from the main driver amplifier AMP0 and the output signal of the DUT 102, and the amplitude becomes half, that is, 0.5V since the impedance matching is achieved.

Since $\gamma=\delta$ is valid, the amplitudes of both the first replica driver amplifier AMP1 and the second replica driver amplifier AMP2 are equal to the amplitude of the main driver amplifier AMP0. In addition, since $\epsilon \cdot$Vo=0.355V is valid, the output signal of the first replica driver amplifier AMP1 is shifted in the positive direction by 0.355V, and the second replica driver amplifier AMP2 is shifted in the negative direction by 0.355V.

The output signal FAIL_H of the first comparator CMP1 is Lo when Vhp<Vhn and is Hi when Vhp>Vhn. In this case, the condition Vhp<Vhn corresponds to the condition (Vup−Vun)>Vo. In other words, the output signal FAIL_H of the first comparator CMP1 shows the result of comparing (Vup−Vun) with +Vo.

Similarly, the output signal FAIL_L of the second comparator CMP2 is Lo when Vlp<Vln and is Hi when Vlp>Vln. In this case, the condition Vlp<Vln corresponds to the condition (Vup−Vun)<−Vo. In other words, the output signal FAIL_L of the second comparator CMP2 shows the result of comparing (Vlp−Vln) with −Vo.

Figure 4:
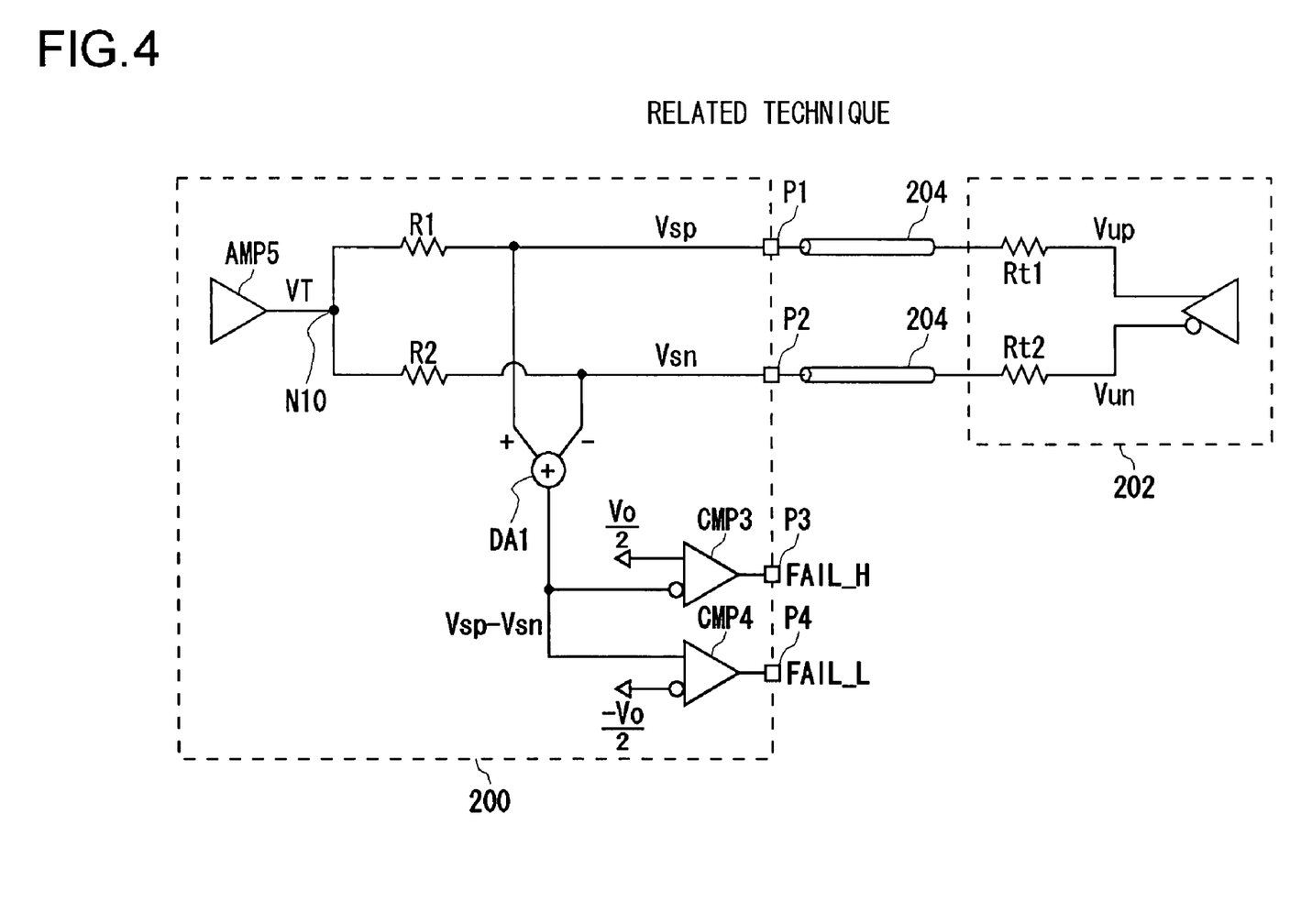
FIG. 4 is a circuit diagram showing the configuration of a conventional ATE.

FIG. 4 is a circuit diagram showing the configuration of a conventional ATE to be compared with the ATE 100 in FIG. 1. For the sake of simplifying the explanation, it is assumed that the output signal of the transmission amplifier AMP5 of the ATE 200 is fixed to a terminal voltage VT. The differential signal Vs at the ATE 200 side of the differential transmission line 204 is a divided voltage of the terminal voltage VT and the differential signal Vu from the DUT 202.

$$Vsp=(VT+Vup)/2$$

$$Vsn=(VT+Vun)/2$$

In the conventional ATE 200, a differential amplifier (analog subtractor) DA1 for generating the differential component (Vsp−Vsn) of the differential signal Vs is provided.

The output signal Vsp−Vsn of the differential amplifier DA1 is given by the following equation.

$$Vsp-Vsn=(Vup-Vun)/2$$

The comparator CMP3 compares the differential component (Vsp−Vsn) with a determination threshold voltage Vo/2 and then outputs the determination signal FAIL_H. In other words, the output signal of the comparator CMP3 is the result of comparing the differential component (Vup−Vun) of the differential output signal Vu of the DUT 202 with the determination threshold voltage V0. Similarly, since the comparator CMP4 compares the differential component (Vsp−Vsn) with the determination threshold voltage −Vo/2, its output signal is the result of comparing the differential component (Vup−Vun) of the differential output signal Vu of the DUT 202 with the determination threshold voltage −Vo. The amplitude of the differential output signal Vu of the DUT 202 is compared with a threshold and when the amplitude does not meet the threshold, the determination signals FAIL_H and FAIL_L generated by the ATE 200 in FIG. 4 turn to high level.

In the circuit in FIG. 4, the differential amplifier DA1 for generating the differential component of the differential signal received at the ATE 200 is required. If a transmission signal is transmitted at high speed, the designing of the differential amplifier DA1 becomes more difficult, resulting in problems in the circuit area and the cost. In contrast, the advantage of having the ATE 100 shown in FIG. 1 is that the differential amplifier DA1 is no more required.

The configuration and the operation of the ATE 100 according to the embodiments is explained. These embodiments are intended to be illustrative only and it will be obvious to those skilled in the art that various variations to constituting elements and processes could be developed and that such variations are also within the scope of the present invention. Such variations are shown in the following.

Figure 5:
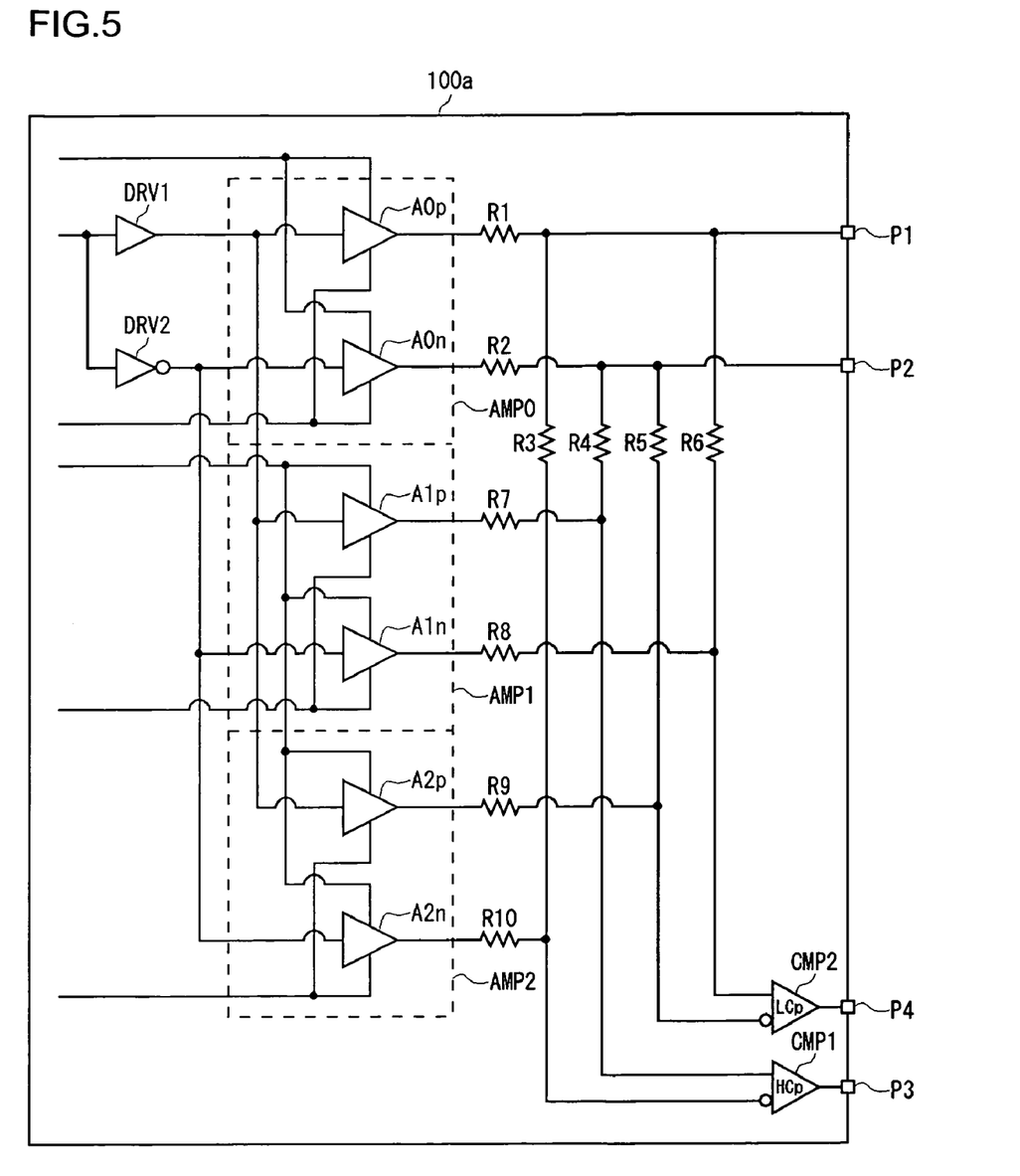
FIG. 5 is a circuit diagram showing the configuration of an ATE according to a first exemplary variation.

As shown in FIG. 1, the differential amplifier may be used to constitute the main driver amplifier AMP0, the first replica driver amplifier AMP1, and the second replica driver amplifier AMP2, or two single amplifiers may also be used. FIG. 5 is a circuit diagram showing the configuration of an ATE 100a according to a first exemplary variation. Each of the amplifiers AMP0, AMP1, and AMP2 are provided with two single amplifiers A0p, A0n, A1p, A1n, A2p, and A2n. A driver DRV1 drives single amplifiers A0p, A1p, and A2p, respectively, of the amplifiers AMP0, AMP1, and AMP2 based on the pattern data PAT. A driver DRV2 causes the pattern data PAT to be inverted and drives single amplifiers A0n, A1n, and A2n, respectively, of the amplifiers AMP0, AMP1, and AMP2. In other words, the main driver amplifier AMP0 includes both a first single amplifier A0p, which generates one of the first differential signals Vdp based on the pattern data PAT, and a second single amplifier A0n, which generates the other first differential signal Vdn based on the inverted pattern data PAT. The same applies to the first replica driver amplifier AMP1 and the second replica driver amplifier AMP2.

The same effects as those obtained in FIG. 1 can also be obtained in the circuit in FIG. 5. The amplifiers AMP0, AMP1, and AMP2 may be constituted with single amplifiers and differential amplifiers in combination.

Figure 6:
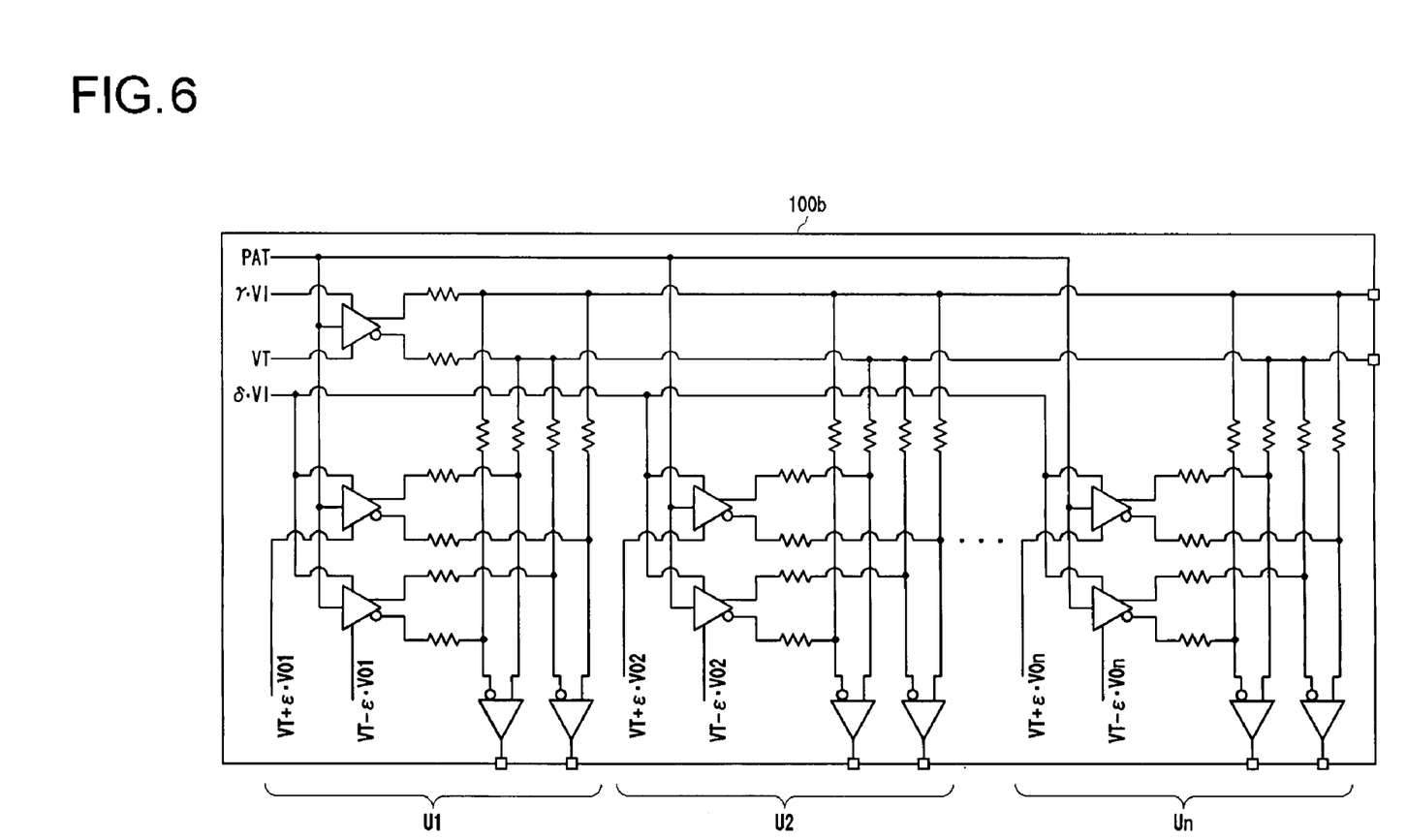
FIG. 6 is a circuit diagram showing the configuration of an ATE according to a second exemplary variation.

In the circuit in FIG. 1, the case where the differential output signal Vu of the DUT 102 is compared with a pair of the determination threshold voltages is explained. The differential output signal Vu may also be compared with multiple determination threshold voltages. FIG. 6 is a circuit diagram showing the configuration of an ATE 100b according to a second exemplary variation. The ATE 100b is provided with n number of determination units U1-Un. The basic configuration of each unit is equivalent to that of the above stated ATE 100 and only the main driver amplifier AMP0 is shared by multiple units. Different common voltages VO1-VOn are applied to the first replica driver amplifier AMP1 and the second replica amplifier AMP2, corresponding to respective units.

The amplitude of the differential signal from the DUT (not shown) can be compared with the determination threshold voltages ±VO1, ±VO2, . . . , ±Von in the ATE 100b in FIG. 6. Since the multiple units are connected to a differential transmission line in the circuit in FIG. 6, all parameters need to be calculated based on the above stated constraint conditions; however, the same principle as in FIG. 1 applies.

Figure 7:
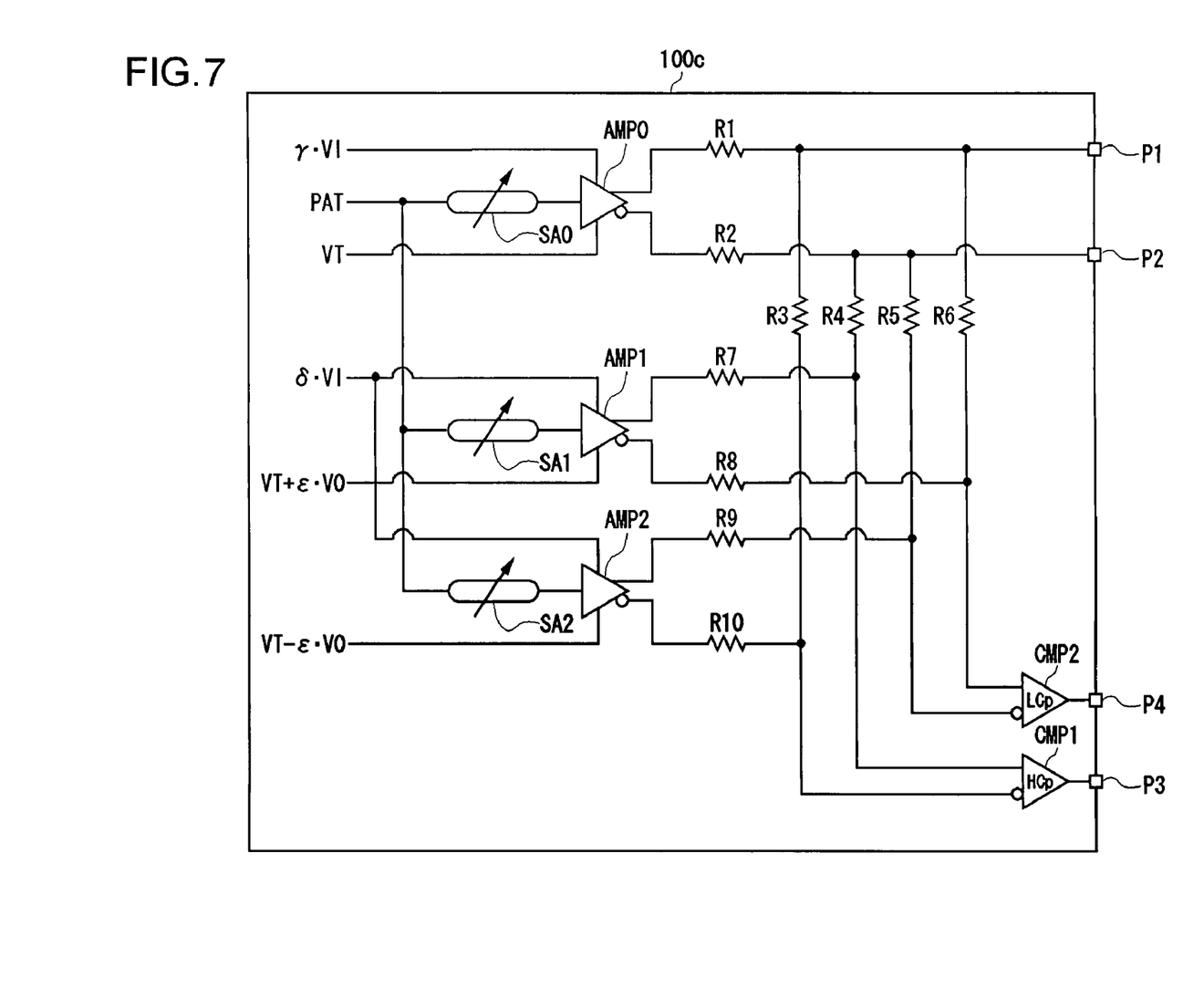
FIG. 7 is a circuit diagram showing the configuration of an ATE according to a third exemplary variation.

FIG. 7 is a circuit diagram showing the configuration of an ATE 100c according to a third exemplary variation. The ATE 100c in FIG. 7 is provided with skew adjusters SA0-SA2 for producing a lag in the pattern data PAT and for adjusting skews, before the main driver amplifier AMP 0, the first replica driver amplifier AMP 1, and the second replica driver amplifier AMP2. Commonly-used delay circuits, phase shifters, etc. may be used for the skew adjusters, and their configurations are not particularly limited.

When the main driver amplifier AMP0, the first replica driver amplifier AMP1, and the second replica driver amplifier AMP2 have intrinsic skews attributed to variations in design and fabrication, it is difficult to eliminate interference caused by the main driver amplifier AMP0 from the input signals of the first comparator CMP1 and of the second comparator CMP2 without adjusting the variations. In the exemplary variation in FIG. 7, by adjusting the skews for the respective amplifiers by using the skew adjusters provided before the amplifiers, the above stated problems can be solved.

In FIG. 1, when the main driver amplifier AMP0, the first replica driver amplifier AMP1, and the second replica driver amplifier AMP2 have intrinsic rise times (slew rates) attributed to variations in design and fabrication, it is difficult to eliminate the interference caused by the main driver amplifier AMP0 from the input signals of the first comparator CMP1 and of the second comparator CMP2 without adjusting the variations. A mechanism for the minor adjustment of the rise time may be provided in each main driver amplifier AMP0, first replica driver amplifier AMP1, and second replica driver amplifier AMP2. A publicly known technique such as the adjustment of a bias current of an amplifier may be used for the adjustment of the rise time, and the method is not limited.

Figure 8:
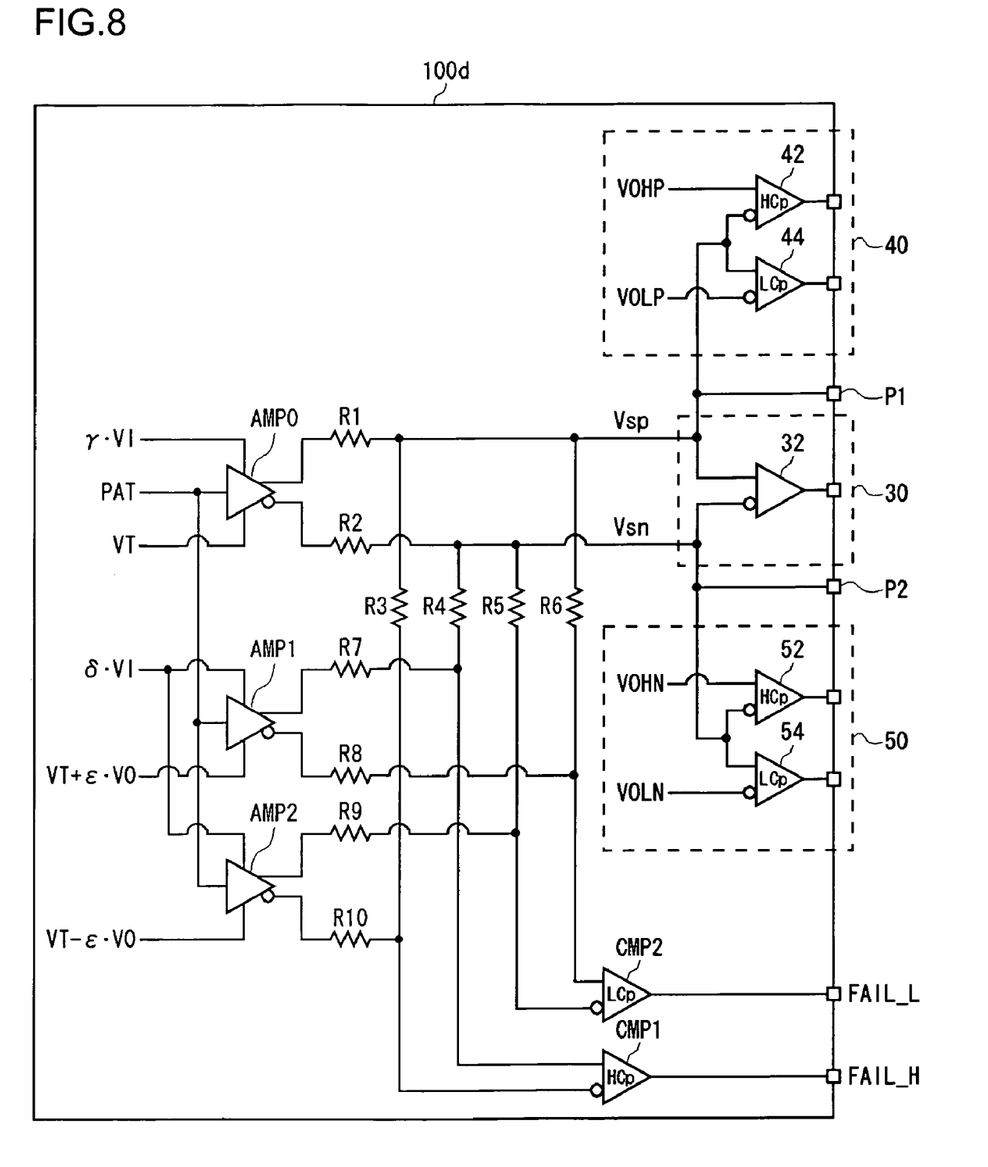
FIG. 8 is a circuit diagram showing the configuration of an ATE according to a fourth exemplary variation.

FIG. 8 is a circuit diagram showing the configuration of an ATE 100d according to a fourth exemplary variation. In addition to having the configuration in FIG. 1, the ATE 100d in FIG. 8 is provided with a cross-point monitoring differential comparator 30, a positive-side single-ended comparator 40, and a negative-side single-ended comparator 50.

The cross-point monitoring differential comparator 30 includes a comparator 32 and compares the voltage of a first input/output terminal P1, that is, the voltage level of the positive-side signal Vsp of the differential signal Vs with the voltage of a second input/output terminal P2, that is, the voltage level of the negative-side signal Vsn. Providing the cross-point monitoring differential comparator 30 allows the cross point of the differential signal Vs to be detected.

A first comparator 42 of the positive-side single-ended comparator 40 compares the positive-side signal Vsp of the differential signal Vs with a first threshold voltage VOHP, and a second comparator 44 compares the positive-side signal Vsp of the differential signal Vs with a second threshold voltage VOLP. A first comparator 52 of the negative-side single-ended comparator 50 compares the negative-side signal Vsn of the differential signal Vs with a third threshold voltage VOHN, and a second comparator 54 compares the negative-side signal Vsn of the differential signal Vs with a fourth threshold voltage VOLN.

Providing the positive-side single-ended comparator 40 and the negative-side single-ended comparator 50 allows the differential signal Vu output from the DUT 102 (not shown) to be measured not as a differential signal but as a single-ended signal.

In combination with the exemplary variation in FIG. 7 or with a circuit where the rise time for an amplifier is adjustable, the exemplary variation in FIG. 8 is particularly effective. When combined with the circuit in FIG. 7, the intrinsic skews that the main driver amplifier AMP0, the first replica driver amplifier AMP1, and the second replica driver amplifier AMP2 possess can be measured by using the cross-point monitoring differential comparator 30, and the measurement results can be reflected in the skew adjusters SA0-SA2.

Also, using the positive-side single-ended comparator 40 and the negative-side single-ended comparator 50 allows the intrinsic rise times of the main driver amplifier AMP0, the first replica driver amplifier AMP1, and the second replica driver amplifier AMP2 to be measured, and the measurement results can be reflected in the adjustment of the rise time of each amplifier.

In the ATE 100 according to the above stated embodiment, the upper determination threshold voltage and lower determination threshold voltage to be compared with the differential signal (Vup–Vun) are set to have the same absolute value. However, not only the embodiment but various variations with different values will also be within the scope of the present invention.

While the preferred embodiments of the present invention have been described using specific terms, such description is for illustrative purposes only, and it is to be understood that changes and variations may be made without departing from the spirit or scope of the appended claims.

What is claimed is:

1. A test apparatus operative to transmit a differential signal bidirectionally to and from a device under test via a differential transmission line pair and to test the device under test, comprising:
    a main driver amplifier operative to generate a first differential signal based on pattern data to be transmitted to the device under test;
    a first replica driver amplifier operative to generate a second differential signal based on the pattern data;
    a second replica driver amplifier operative to generate a third differential signal based on the pattern data;
    a first comparator;
    a second comparator;
    a first resistor provided between one output terminal of the main driver amplifier and a first terminal to which one of the differential transmission line pair is connected;
    a second resistor provided between the other output terminal of the main driver amplifier and a second terminal to which the other of the differential transmission line pair is connected;
    a third resistor provided between the first terminal and one input terminal of the first comparator;
    a fourth resistor provided between the second terminal and the other input terminal of the first comparator;
    a fifth resistor provided between the second terminal and one input terminal of the second comparator;
    a sixth resistor provided between the first terminal and the other input terminal of the second comparator;
    a seventh resistor provided between one output terminal of the first replica driver amplifier and the other input terminal of the first comparator;
    an eighth resistor provided between the other output terminal of the first replica driver amplifier and the other input terminal of the second comparator;
    a ninth resistor provided between one output terminal of the second replica driver amplifier and one input terminal of the second comparator; and
    a tenth resistor provided between the other output terminal of the second replica driver amplifier and one input terminal of the first comparator.

2. The test apparatus according to claim 1 wherein a common voltage of the first replica driver amplifier is a voltage obtained by shifting a common voltage of the main driver amplifier in a positive direction, and a common voltage of the second replica driver amplifier is a voltage obtained by shifting a common voltage of the main driver amplifier in a negative direction.

3. The test apparatus according to claim 1 wherein the first and second replica driver amplifiers are configured so that common voltages of the second differential signal and the third differential signal can be adjusted.

4. The test apparatus according to claim 1 wherein when resistances of both the first and the second resistors are written as Ra, the resistances of the third resistor to the sixth resistor are approximately equal and are given as $\alpha \cdot Ra$ ($\alpha$ is a parameter), and the resistances of the seventh resistor to the tenth resistor are approximately equal and are given as $\beta \cdot Ra$ ($\beta$ is a parameter).

5. The test apparatus according to claim 4 wherein when an amplitude at half-maximum of the differential signal transmitted to the device under test via the differential transmission line is written as VI, when an amplitude at half-maximum of the first differential signal generated by the main driver amplifier is written as $\gamma \cdot VI$, and when amplitudes at half-maximum of the second and third differential signals are written as $\delta \cdot VI$, the following equations $$\delta = \beta/(2 \cdot \alpha)$$

and $$\gamma = [\alpha \cdot (\alpha + \beta + 2) + \beta]/[\alpha \cdot (\alpha + \beta)]$$

are satisfied.

6. The test apparatus according to claim 4 wherein $\alpha$ and $\beta$ satisfy a relational expression as follows:

$$\beta = [\alpha + 2 + \sqrt{(9 \cdot \alpha^2 + 20 \cdot \alpha + 4)}]/2.$$

7. The test apparatus according to claim 4 wherein when the common voltage of the first replica driver amplifier is the common voltage of the main driver amplifier shifted by $\epsilon \cdot VO$ in a positive direction, and when the common voltage of the second replica driver amplifier is the common voltage of the main driver amplifier shifted by $\epsilon \cdot VO$ in a negative direction, an equation $\epsilon = \beta/(4 \cdot \alpha)$ is satisfied.

8. The test apparatus according to claim 1 wherein current drivabilities of the first and second replica driver amplifiers are lower than current drivability of the main driver amplifier.

9. A test apparatus comprising:
    a plurality of test apparatuses according to claim 1 that are connected to a same differential transmission line and configured so that main driver amplifiers and first and second resistors of the plurality of test devices are shared.

10. The test apparatus according to claim 1 further comprising a skew adjuster, which is provided before at least one of the main driver amplifier and the first and second replica driver amplifiers, operative to adjust a phase of the pattern data input.

11. The test apparatus according to claim 1 wherein at least one among the main driver amplifier, the first replica amplifier, and the second replica driver amplifier is configured so that the rise time of a signal can be adjusted.

12. The test apparatus according to claim 1 wherein at least one among the main driver amplifier, the first replica driver amplifier, and second replica driver amplifier includes:
    a first single amplifier operative to generate one of differential signals based on the pattern data; and
    a second single amplifier operative to generate the other differential signal based on the pattern data that is inverted.

13. The test apparatus according to claim 1 further comprising:
    a cross-point monitoring differential comparator operative to compare voltage levels of the first terminal and the second terminal;
    a positive-side single-ended comparator operative to compare a voltage of the first terminal with a predetermined first threshold voltage and compare the voltage of the first terminal with a predetermined second threshold voltage; and a negative-side single-ended comparator operative to compare a voltage of the second terminal with a predetermined third threshold voltage and compare the voltage of the second terminal with a predetermined fourth threshold voltage.

* * * * *